United States Patent
Chan et al.

(10) Patent No.: US 8,580,635 B2
(45) Date of Patent: Nov. 12, 2013

(54) METHOD OF REPLACING SILICON WITH METAL IN INTEGRATED CIRCUIT CHIP FABRICATION

(75) Inventors: Kevin K. Chan, Staten Island, NY (US); Christopher D'Emic, Ossining, NY (US); Young-Hee Kim, Mohegan Lake, NY (US); Dae-gyu Park, Poughquaq, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/310,796

(22) Filed: Dec. 5, 2011

(65) Prior Publication Data

US 2013/0140634 A1   Jun. 6, 2013

(51) Int. Cl.
*H01L 21/8238* (2006.01)

(52) U.S. Cl.
USPC .......................................... 438/229; 257/347

(58) Field of Classification Search
USPC .......... 257/347, 369, 310, E21.444, 410, 632; 438/585, 229
See application file for complete search history.

(56) References Cited

U.S. PATENT DOCUMENTS

| | | | | |
|---|---|---|---|---|
| 4,727,266 | A * | 2/1988 | Fujii et al. | 326/27 |
| 5,032,541 | A * | 7/1991 | Sakamoto et al. | 438/571 |
| 7,674,698 | B2 * | 3/2010 | Forbes et al. | 438/585 |
| 2002/0014672 | A1 * | 2/2002 | Noble et al. | 257/413 |
| 2002/0063283 | A1 * | 5/2002 | Pan et al. | 257/344 |
| 2008/0054330 | A1 * | 3/2008 | Forbes et al. | 257/310 |

* cited by examiner

*Primary Examiner* — Kyoung Lee
*Assistant Examiner* — Christina Sylvia
(74) *Attorney, Agent, or Firm* — Law Office of Charles W. Peterson, Jr.; Louis J. Percello, Esq.

(57) ABSTRACT

A method of replacing semiconductor material with metal, Replacement Metal Gate Field Effect Transistors (RMG FETs) and Contacts (RMCs), and Integrated Circuit (IC) chips including the FETs and/or RMCs. A patterned semiconductor layer, e.g., silicon, is formed on a dielectric layer, e.g., a layered gate dielectric. A field dielectric layer fills between shapes in the patterned semiconductor layer. Metal is deposited on the shapes. The wafer is annealed to replace semiconductor in each shape with metal to form metal FET gates or contacts.

21 Claims, 9 Drawing Sheets

METHOD OF REPLACING SILICON WITH METAL IN INTEGRATED CIRCUIT CHIP FABRICATION

BACKGROUND OF THE INVENTION

1. Field of the Invention

The present invention generally relates to Integrated Circuit (IC) manufacture and more particularly to reducing costs in semiconductor chip manufacture of integrated circuits with Field Effect Transistors (FETs) with metal gates and/or metal contacts.

2. Background Description

A primary goal in integrated circuit (IC) chip manufacturing is increasing chip density and performance, i.e., placing more function that operates at higher speeds. To achieve that goal, semiconductor technology and chip manufacturing advances have steadily decreased chip feature size. Devices, or field effect transistors (FETs), are formed by stacking layers of shapes on the IC, e.g., printed layer by layer on a wafer using photolithographic techniques.

Shrinking/reducing chip features to increase density provides a corresponding reduction in minimum device horizontal dimensions, e.g., minimum channel length and or wire widths. Using shorter devices allows/requires thinner vertical feature dimensions, e.g., shallower channel layer and junction depth, thinner gate dielectric, wires and vias. Smaller devices operate under reduced operating conditions, as well, i.e., lower chip (and correspondingly device) supply voltages. Chip signals have reduced voltage swings as well, which results in increased switching frequency, i.e., performance.

Generally, all other factors being constant, the active power consumed by a given unit increases linearly with switching frequency, i.e., increased circuit performance. Thus, notwithstanding the decrease of chip supply voltage, chip power consumption has increased as well. At both chip level and system level, cooling and packaging costs have escalated as a natural result of this increase in chip power. Especially for low end systems (e.g., handhelds, portable and mobile systems), where battery life is crucial, reducing net power consumption is important. However, since improving performance means running circuits faster (with higher switching speeds), reducing chip power consumption is at odds with improving performance. Thus, power reduction must come without degrading chip/circuit performance below an acceptable level.

To minimize semiconductor circuit power consumption, most state of the art ICs are made in the well-known complementary insulated gate FET technology known as CMOS. Moreover, state of the art CMOS chips are frequently made in a silicon on insulator (SOI) technology, where CMOS devices are formed in a thin uniform silicon surface layer. Whether on a bulk wafer or in SOI, a typical CMOS circuit includes paired complementary devices, i.e., an n-type FET (NFET) paired with a corresponding p-type FET (PFET), usually both gated by the same signal.

In an ideal NFET, for example, current only flows when the gate to source voltage ($V_{gs}$) exceeds the device threshold voltage ($V_T$) and is determined in part by the amount that it exceeds the $V_T$, i.e., by $V_{gs}-V_T$. PFETs operate analogously. FET drain to source current ($I_{ds}$, which is considered DC current and so, DC power ($I_{ds}V_{supply}$) consumed) is dependent upon circuit conditions, device characteristics (e.g., width, length, channel mobility and threshold voltage) and device bias voltages.

Since the pair of devices in an ideal inverter have operating characteristics that are, essentially, opposite each other, when one device (e.g., the NFET) is on and conducting (modeled simply as a closed switch), the other device (the PFET) is off, not conducting (ideally modeled as an open switch) and, vice versa. Thus, ideally, there is no static or DC current path in a typical CMOS circuit and ideal CMOS circuits use no static or DC power and only consume transient power from charging and discharging capacitive loads.

In practice, however, typical FETs are much more complex than switches. So, transient power for circuit loads (from switching currents) accounts for only a portion of CMOS chip power. Especially since device $V_T$ is directly proportional to gate dielectric thickness and also dependent on channel length, as FET features (including gate dielectric and channel length and thickness) shrink, current may continue to flow through off FETs in what is known as subthreshold current.

Subthreshold current is current conduction at gate biases below FET threshold and is directly proportional to gate width. Also, for any particular device, subthreshold current increases exponentially with the magnitude of the device's drain to source voltage ($V_{ds}$) and reduces exponentially with the magnitude of the device's $V_T$. Especially for complex chips and arrays with a large number of devices, short channel effects can be overwhelming. When multiplied by the millions and even billions of devices on a state of the art IC, even 100 picoAmps (100 pA) of leakage in each of a million circuits, for example, results in chip leakage on the order of 100 milliAmps (100 mA).

Replacing FET gate oxide with a high-k dielectric has eliminated most of this unwanted gate oxide leakage. Unfortunately, however, polysilicon cannot be used with high-k dielectrics. Consequently, polysilicon is being replaced with work function metal and aluminum in what is known as Replacement Metal Gate (RMG) FET technologies.

On a typical state of the art RMG technology chip, FETs are fully formed with a polysilicon gate acting as a placeholder. Once completed or near complete, polysilicon gate is removed which opens a trench over exposed device channels. The gate oxide may also be removed with the polysilicon placeholders. Then, metal (on high-k dielectric) fills the trenches left by removing the polysilicon, e.g., by sputtering metal or otherwise depositing metal. Removing excess metal, e.g., chemically-mechanically (chem-mech) polishing (CMP) surface metal away, finishes the gates.

Typically, for minimum channel length FETs, the gate cross section has a relatively tall-narrow aspect ratio, e.g., 3:1 to 1:1. Small dimension trenches opened by removing polysilicon gates are subjected to compressive strain to exposed sidewalls. This strain causes these narrow aspect ratio trenches to buckle and partially collapse, such that frequently the top of some trenches close (pinch off). Even in trenches that are not completely closed because of pinch off, pinch off may prevent partially closed trenches from filling completely with metal during sputtering. Consequently, pinch off can leave subsurface voids or prevent metal gate formation altogether. Even in those metal gates that form with voids, the voids can introduce resistance or act as a dielectric above the high-k dielectric, randomly altering device characteristics unintentionally.

Likewise, shrinking horizontal features for density has meant that minimum-sized interlevel contacts also have a tall, narrow cross section. An interlevel-contact is by design a metal plug in a via between wiring layers. Like the narrow aspect ratio gate trenches, compressive strain on narrow aspect ratio vias can pinch-off the vias before they are filled with metal. Consequently, some contacts may not form, while voids form in others that reduce contact area randomly.

Missing contacts can cause a circuit and chip failure, i.e., yield loss. Random voids raise contact resistance in one via but not in, or differently than in, others introducing random parasitic path resistance. This random resistance can cause erratic failures that are difficult to identify and may not manifest until a chip is in place in the field. These missing contacts and contact voids raise manufacturing costs and degrade chip quality, making it difficult to reliably make consistent structures. Consequently, trench aspect ratio has been a limit both on reducing RMG device length and on increasing contact density.

Thus, there exists a need in Integrated Circuits (ICs) for improving RMGFET chip quality, cost and reliability; and more particularly, to avoiding trench pinch off in replacing semiconductor with metal for gates and for forming high aspect ratio metal contacts.

SUMMARY OF THE INVENTION

It is an aspect of the invention to reduce short channel effects in Integrated Circuits (ICs) without impairing performance;

It is another aspect of the invention to improve replacement metal gate FET chip reliability and quality;

It is yet another aspect of the invention to improve replacement metal contact reliability and quality;

It is yet another aspect of the invention to reduce pinch off in replacement metal gate FET fabrication;

It is yet another aspect of the invention to reduce pinch off in replacement metal contacts;

The present invention relates to a method of replacing semiconductor material with metal, Replacement Metal Gate Field Effect Transistors (RMG FETs) and Contacts (RMCs), and Integrated Circuit (IC) chips including the FETs and/or RMCs. A patterned semiconductor layer, e.g., silicon, is formed on a dielectric layer, e.g., a layered gate dielectric. A field dielectric layer fills between shapes in the patterned semiconductor layer. Metal is deposited on the wafer and patterned to the shapes. The wafer is annealed to replace semiconductor in each shape with metal to form metal FET gates or contacts.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
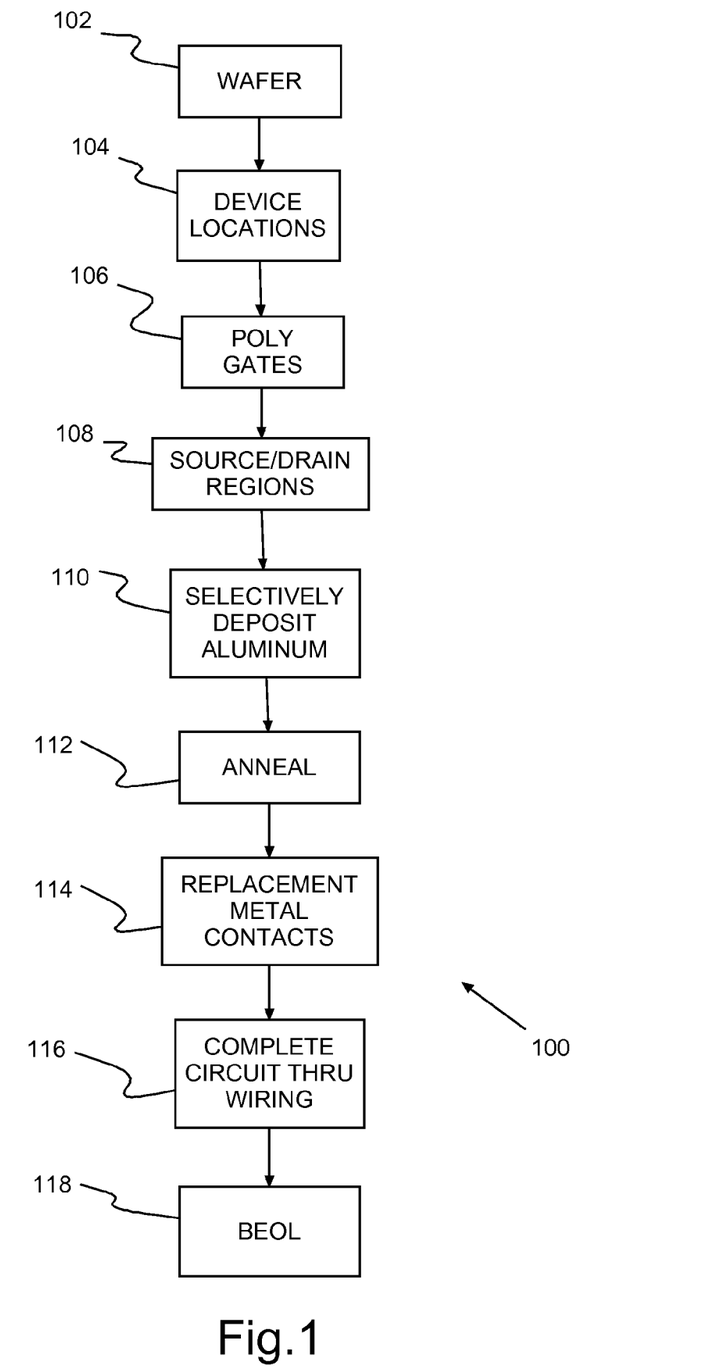
FIG. 1 shows an examples of steps of forming Replacement Metal Gate (RMG) gate Field Effect Transistors (FETs) or RMGFETs and optional Replacement Metal Contacts (RMCs), according to a preferred embodiment of the present invention.

Turning now to the drawings and, more particularly, FIG. 1 shows an example of a method 100 of forming semiconductor devices, Replacement Metal Gate (RMG) gate Field Effect Transistors (FETs) or RMGFETs, as well as optionally or alternately form Replacement Metal Contacts (RMCs), according to a preferred embodiment of the present invention. Although described with reference to silicon on insulator (SOI) technology, and more particularly CMOS, the present invention has application to any suitable replacement metal technology. Further, the preferred method 100 has application to forming ICs with only RMGFETs or RMC or both.

IC fabrication begins with a preparing 102 a semiconductor wafer, e.g., an SOI wafer. Device locations are defined 104 on the silicon surface layer of the multilayered SOI wafer. Semiconductor, preferably silicon, gates are formed 106 in the device locations. Metal, preferably aluminum (Al), is deposited 110 on the silicon gates. The wafer is annealed 112, which diffuses the aluminum into the silicon to replace the silicon gates with the deposited Al. Thereafter, circuit definition continues, which may include forming 114 preferred replacement metal contacts, e.g., depositing aluminum on silicon contact via placeholders and annealing. Wiring 116 connects devices together into circuits and circuits together on chips. Finally, BEOL fabrication (upper level wiring, pads and terminal metallurgy) concludes 118 chip fabrication.

Figure 2:
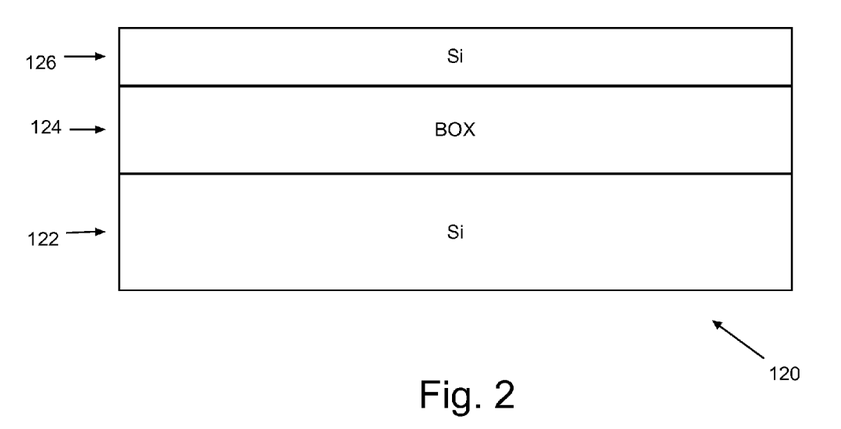
FIG. 2 shows preparing a semiconductor wafer.

As shown in FIG. 2, preparing 102 a semiconductor wafer 120 may begin with a bulk doped or undoped silicon substrate 122. For SOI the wafer 120 may be multilayered with an insulating layer 124, e.g., buried oxide (BOX), on or in the bulk substrate 122 and supporting a silicon surface layer 126. The insulating layer 124 insulates the silicon surface layer 126 from the bulk substrate 122.

Figure 3:
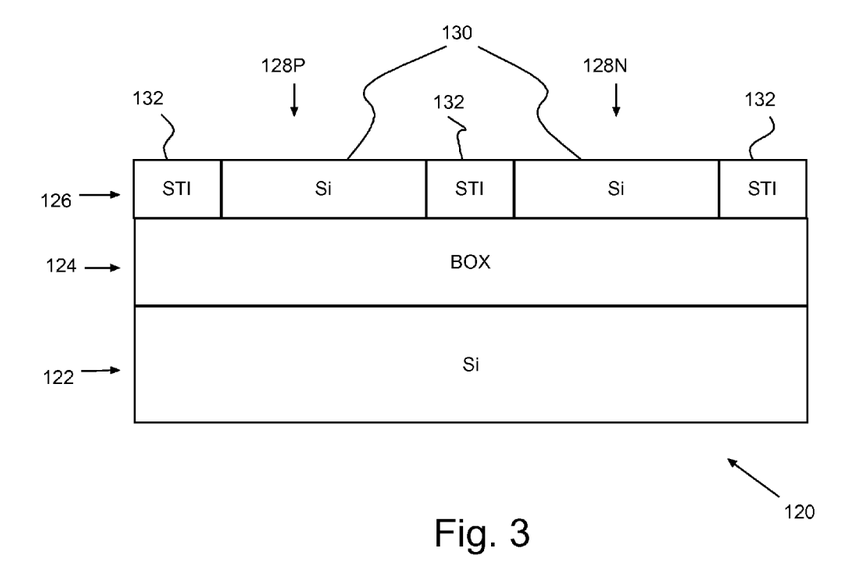
FIG. 3 shows an example of defining device locations.

FIG. 3 shows an example of defining 104 device locations 128P, 128N in this SOI example. Islands 130 are defined in the surface layer 126, e.g., using shallow trench isolation (STI) 132 to define the islands. The islands 130 are doped appropriately, e.g., well doped for N-wells and P-wells and/or channel tailor doping.

Figure 4A:
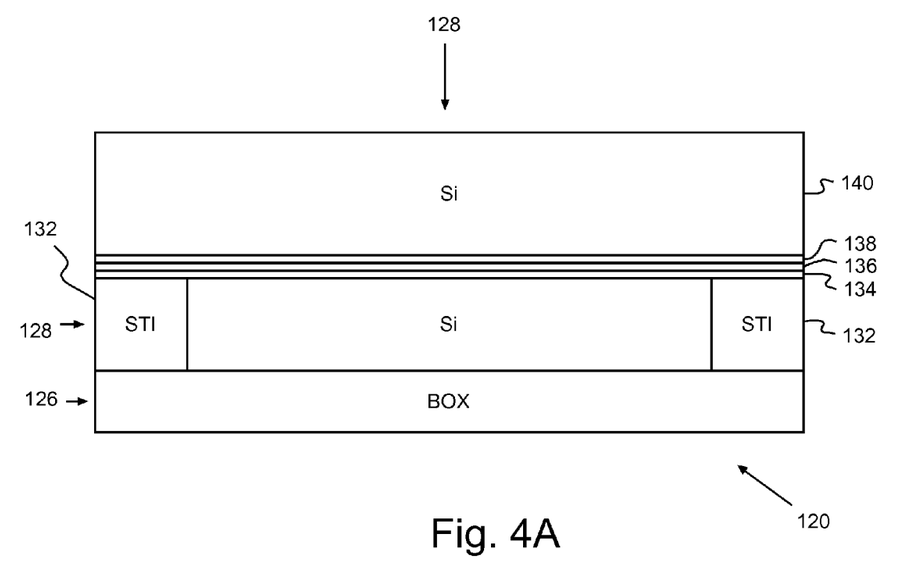
FIGS. 4A-B shows silicon gate formation in a single device location.
Figure 4B:
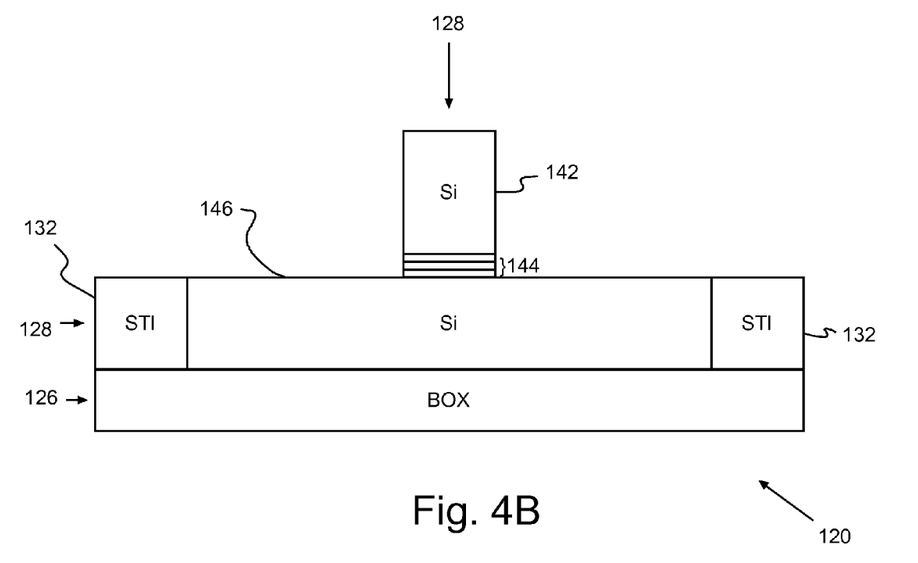

FIGS. 4A-B show silicon gate formation 106 in a single device location 128. First, a gate dielectric layer 134, e.g., a high-k dielectric layer, is formed on the wafer, e.g., deposited on one or more island 128. The high-k dielectric may be any suitable high-k dielectric, such as for example, N-blok (SiCN), silicon nitride (SiN), tantalum pentoxide ($Ta_2O_5$), or hafnium dioxide ($HfO_2$), preferably 10-12 Angstroms (10-12 Å) thick, and most preferably, 10 Å thick. A thin conductive barrier layer 136, preferably 10-100 Å thick, and most preferably, 70 Å thick titanium nitride (TiN) layer, is formed on the gate dielectric layer 134. A second conductive barrier/transition layer 138, preferably 3-10 Å thick, and most preferably, 5 Å thick aluminum nitride (AlN) layer, is formed on conductive barrier layer 136. Then, a sacrificial silicon layer 140, polycrystalline or amorphous silicon, is formed 106 on the second conductive barrier/transition layer 138.

The sacrificial silicon layer 140 is patterned normally, e.g., using a suitable well-known photolithographic mask and etch technique, to define gate placeholders 142 in device locations 128. The gate placeholders 142 define device channels for RMG devices and preferably are shorter than twenty two nanometers (22 nm) long thick and at least 100 nm tall. The resulting tall, thin (channel length) silicon ridges define FET channels, P and N, and serve as gate placeholders 142. Then, before or after removing the gate mask, using tall, thin gate placeholders 142 as a mask, the gate dielectric/barrier stack 144 (134, 136, 138) is patterned re-exposing the island surface 146.

Figure 5A:
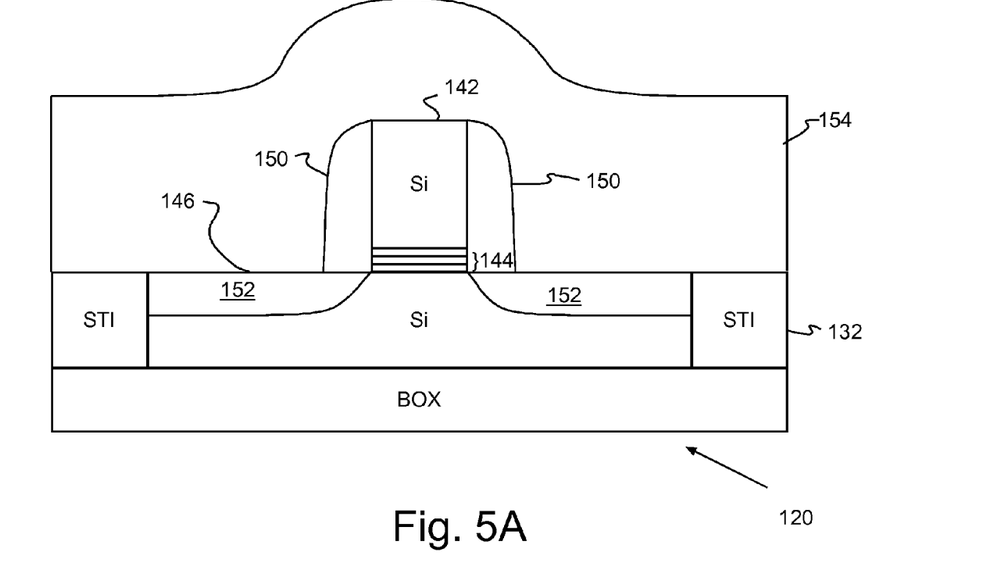
FIGS. 5A-B show source/drain region definition at the gate placeholders.
Figure 5B:
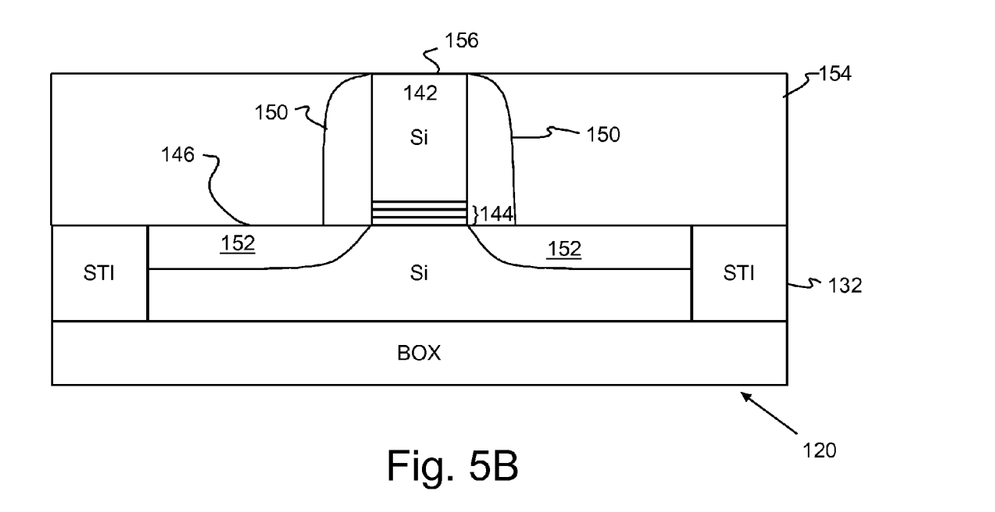

FIGS. 5A-B show source/drain region definition 108 at the gate placeholders 142 of FIG. 4B. First, the wafer is subjected to a P and an N-type halo implant, e.g., using a typical state of the art mask and implant step for each implant. Sidewalls 150 are formed at the gate placeholders 142. Preferably, the sidewalls are nitride formed normally, e.g., depositing a conformal nitride layer and anisotropically etching the horizontal portions of the conformal layer with a reactive ion etch (RIE) for example. Once sidewalls 150 are formed, the source/drain regions 152 are implanted with an appropriate P or N-type source/drain implant, and the implant is diffused. A dielectric layer 154, e.g., oxide, may be formed at least over the source/drain regions 152 and covering the gate placeholders 142. Then, preferably, the wafer is planarized, e.g., using a suitable chemical-mechanical (chem-mech) polish (CMP) that is selective to silicon, and stopping on the upper surface 156 of the gate placeholders 142.

Figure 6:
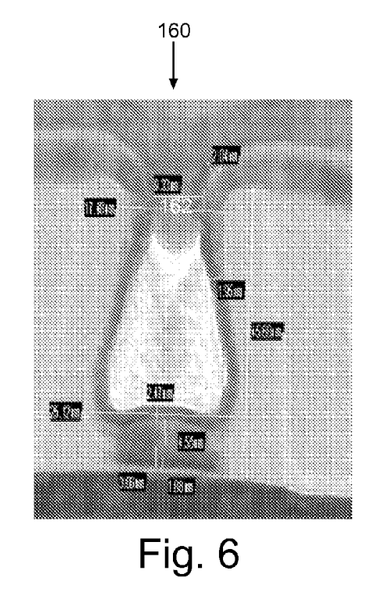
FIG. 6 shows gate trenches refilled with metal according to prior method, wherein metal has collected at the top of the trenches, to close the trenches with voids remaining below the surface.

In a normal state of the art RMG technology, the gate placeholders 142 are removed at this point, which leaves contact trenches 160 that are to be refilled with metal using metal sputtering and evaporation, as shown in the example of FIG. 6. However, as noted hereinabove and as further illustrated in FIG. 6, compressive strain on narrow aspect ratio vias formed by removing placeholders can cause the via trenches 160 to pinch-off, even close at the top 162. This in combination with poor metal coverage and evaporation characteristics, inhibits refilling the trenches 160.

Figure 7:
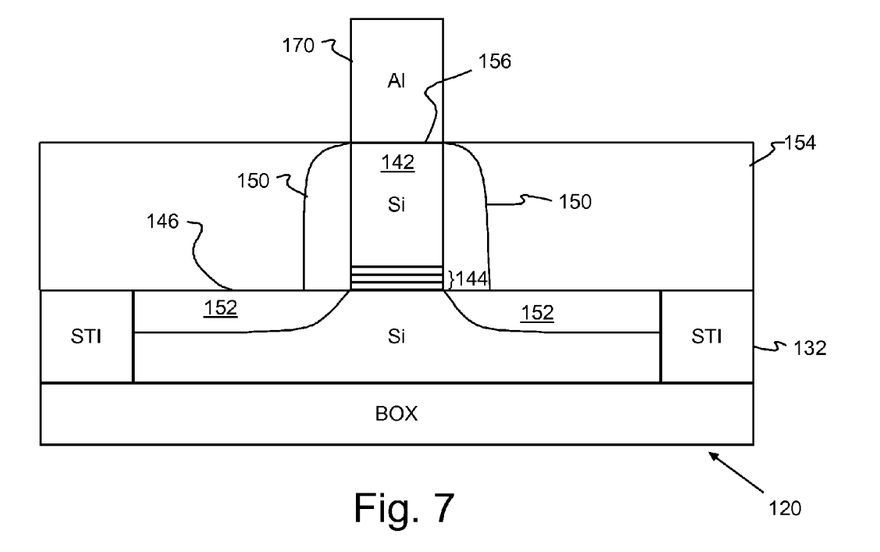
FIG. 7 shows aluminum deposited on the gate placeholders.

According to a preferred embodiment of the present invention as shown in FIG. 7, however, instead of removing the gate placeholders 142; aluminum is deposited 110 and patterned on the gate placeholders 142, preferably, using a suitable lift off technique. Lift off begins by masking the wafer to cover everything except the upper surface 156 of the gate placeholders 142. Then, aluminum is evaporated in a vacuum in the presence of the masked wafer 120, which coats the surface with aluminum. The mask is removed which lifts off aluminum on the mask, i.e., everywhere except at the unmasked gate placeholders 142. Thus, after the lift off aluminum 170 only remains above/on the gate placeholders 142.

Figure 8A:
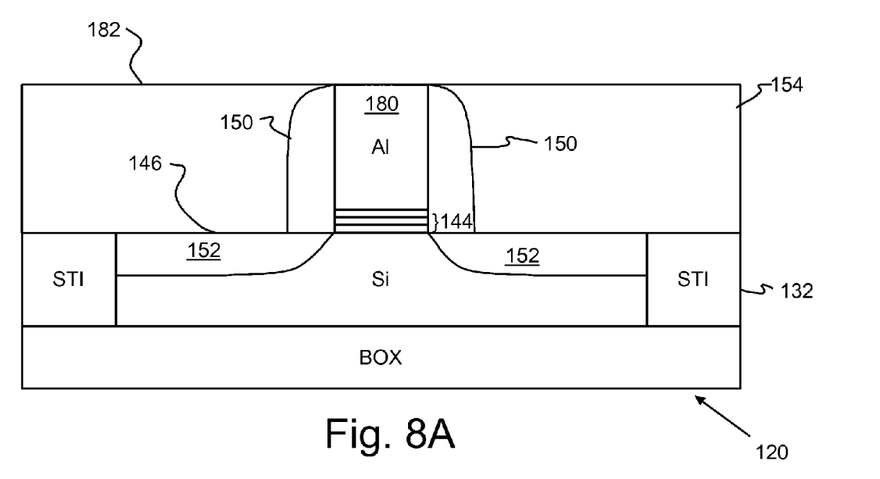
FIGS. 8A and B show aluminum gates having replaced the gate placeholders.

FIG. 8A shows aluminum gates 180 where the gate placeholders 142 previously had been. The wafer is annealed 112 in a rapid thermal anneal (RTA) at four hundred degrees centigrade (400°) for two hours (2 hrs). During RTA the aluminum penetrates and replaces the gate placeholders 142 with the deposited Al. The wafer is subjected to another CMP to remove any excess aluminum from the surface 182, and the RMGFETs are complete.

Figure 8B:
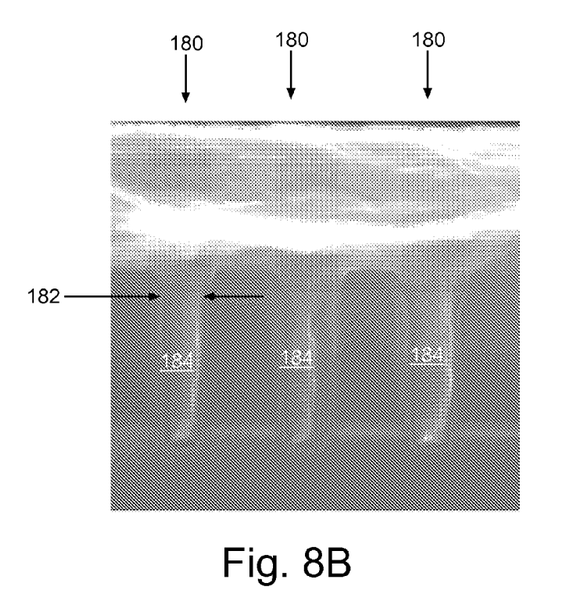

FIG. 8B shows a cross sectional image of a chip through aluminum gates 180 formed according to a preferred embodiment of the present invention. In contrast to the prior art example of FIG. 6, wherein collapsing trenches 160 partially closed them, i.e., pinched them off; the trenches 184 maintain cross sections that are narrowest at the bottom (i.e., channel length) at the layered dielectric 144 and more or less rectangular or trapezoidal, or bowed outward at the top 186.

FIGS. 9A-D show forming 114 optional replacement metal contacts on the wafer 120 of FIG. 8. First, the aluminum gates 180 are capped with thin metal caps 190, preferably 1-3 nanometers (1-3 nm) thick, and most preferably, 1.5 nm thick.

The thin metal caps 190 prevent gate aluminum from migrating from the aluminum gates 180 into the subsequently deposited contact silicon during the subsequent anneal. A typical suitable patterning technique, e.g., photolithographically masking and etching, may be used to pattern a thin capping layer, e.g., chromium (Cr), deposited on the planarized wafer surface 182.

A silicon layer, preferably polysilicon or amorphous silicon, is deposited and patterned to define contact placeholders 192 for interlevel vias. Preferably, silicon is deposited on the wafer 120 and patterned, e.g., using a typical photolithographic mask an etch technique. Interlevel dielectric 194 is formed on the wafer and planarized to expose the top of contact placeholders 192, e.g., using CMP. Aluminum is deposited on the wafer and patterned, e.g., using a typical liftoff technique. Then, the wafer is annealed again in a rapid thermal anneal, wherein aluminum penetrates and replaces the contact placeholders 192 with the deposited Al. The wafer is subjected to another CMP to remove any excess aluminum from the surface, and the RMCs 196 are complete.

Figure 9A:
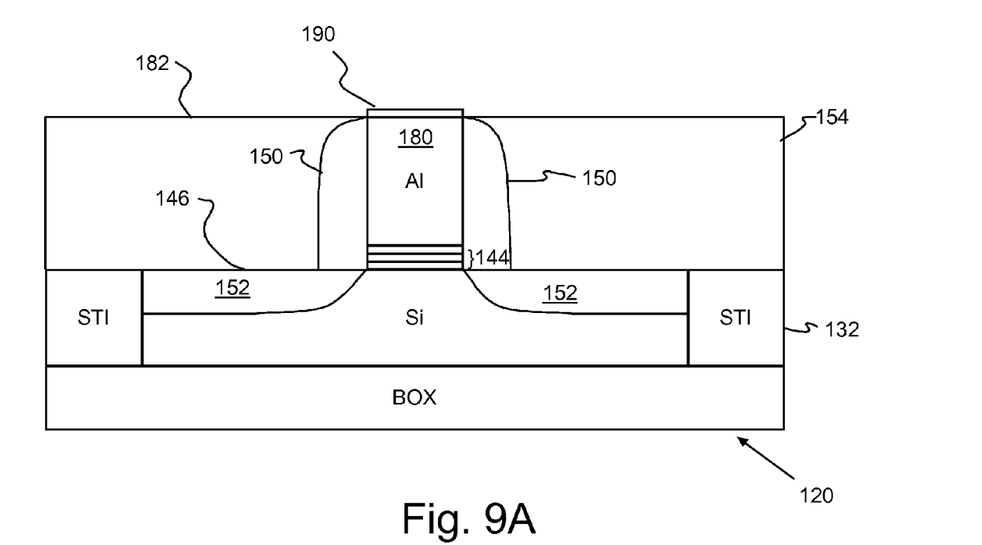
FIGS. 9A-D show optional replacement metal contacts formed on the wafer.
Figure 9B:
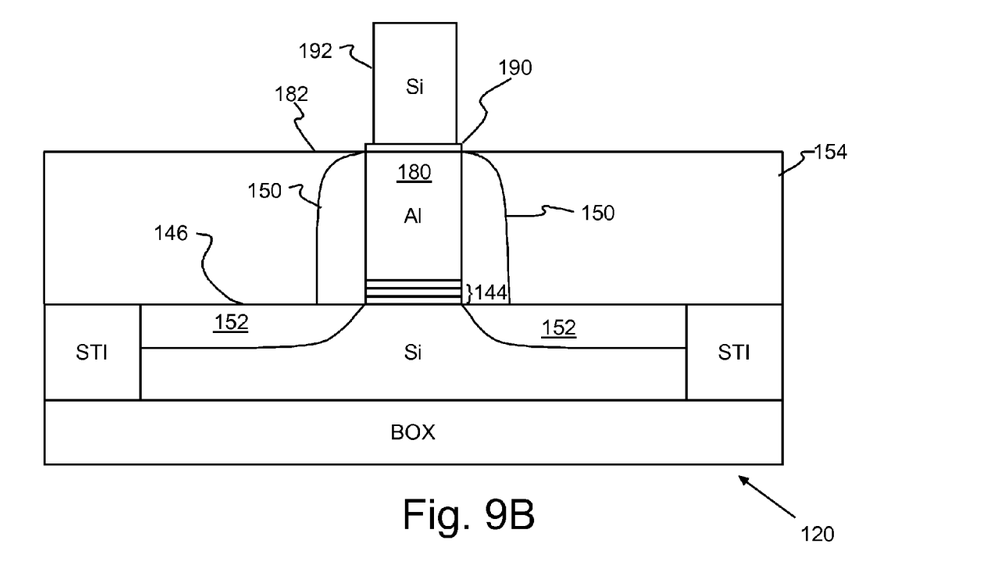
Figure 9C:
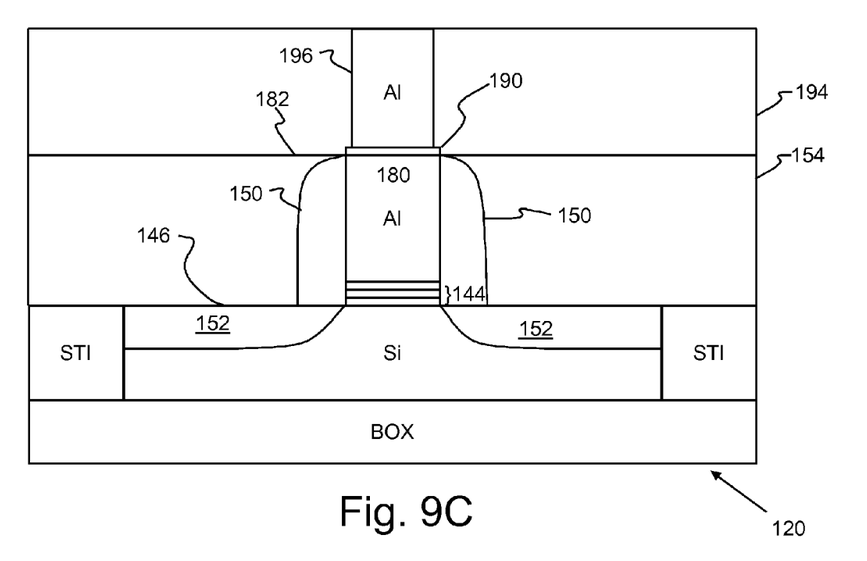
Figure 9D:
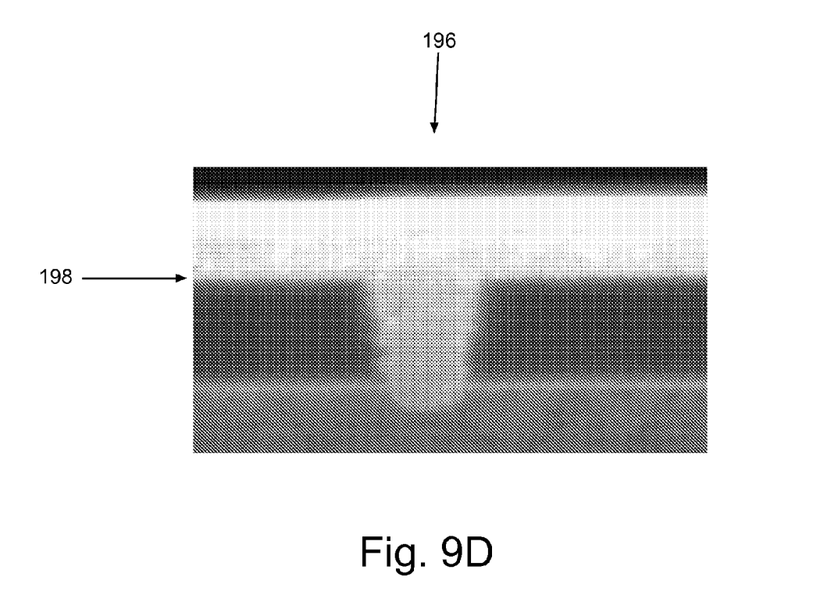

FIG. 9D shows a cross sectional image of a chip through aluminum contacts 196 formed according to a preferred embodiment of the present invention. Like the preferred gates 180 in example of FIG. 9, the RMCs 196 have cross sections that are more or less rectangular or even trapezoidal, or bowed outward at the top 198.

Figure 10:
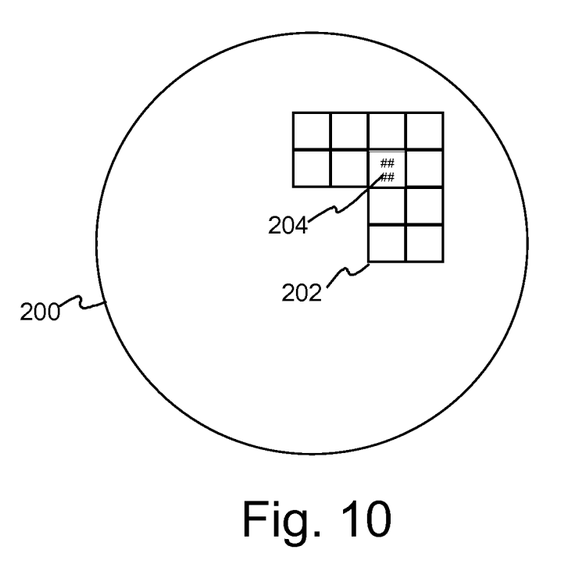
FIG. 10 shows an example of a wafer with chips manufactured according to a preferred embodiment of the present invention.

FIG. 10 shows an example of a wafer 200 with multiple IC chips 202 after forming RMCs 196, according to a preferred embodiment of the present invention. Circuit definition continues normally as wiring is formed 116 on and above the planarized surface. The wiring connects devices (preferred FETs) together into circuits 212 and circuits 212 together on the chips 212. BEOL fabrication continues 118 to complete the chips 212, e.g., connecting the circuits to pads and terminal metallurgy.

Thus advantageously, high aspect ratio silicon, polysilicon or amorphous silicon, is replaced with metal in gates and contacts with the shape of the resulting metal gates and/or contacts being substantially identical to the replaced silicon. Further, preferred metal gates and contacts are not plagued by problems from random voids or missing metal, such as random parasitic resistance or capacitance or missing device gates or random device characteristic variations.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method of replacing semiconductor material with metal, said method comprising:
   forming a patterned semiconductor layer on a dielectric layer;
   forming a field dielectric layer filling between shapes in the patterned semiconductor layer;
   depositing metal on said shapes;
   patterning said deposited metal; and
   annealing said patterned semiconductor layer shapes and said patterned metal, said patterned metal replacing semiconductor in each of said patterned semiconductor layer shapes.

2. A method of replacing semiconductor material with metal as in claim 1, wherein said dielectric layer is a surface layer of a semiconductor wafer, said patterned semiconductor layer shapes are silicon placeholders and said metal is aluminum (Al), and wherein patterning said deposited aluminum comprises patterning a deposited aluminum layer in an aluminum liftoff; and
annealing comprises annealing said wafer in a rapid thermal anneal (RTA) at four hundred degrees centigrade (400°) for two hours (2 hrs).

3. A method of replacing semiconductor material with metal as in claim 2, wherein said silicon placeholders are gate placeholders, said dielectric layer is a layered gate dielectric and forming gate placeholders comprises:

forming a silicon layer on said layered gate layer; and
patterning said silicon layer, silicon gate placeholders remaining at FET locations.

4. A method of replacing semiconductor material with metal as in claim 3, wherein forming said layered gate dielectric comprises:

forming a gate dielectric layer on the surface silicon layer;
forming a conductive barrier layer on said gate dielectric layer; and
forming a second conductive barrier/transition layer on said conductive barrier layer, said layered gate dielectric being patterned with said gate placeholders.

5. A method of replacing semiconductor material with metal as in claim 2, wherein said silicon placeholders are silicon contact placeholders.

6. A method of replacing semiconductor material with metal as in claim 2, wherein said silicon placeholders are polysilicon.

7. A method of replacing semiconductor material with metal as in claim 2, wherein said silicon placeholders are amorphous silicon.

8. A method of forming Field Effect Transistors (FETs), said method comprising:

defining FET locations on a semiconductor surface layer of a wafer;
forming semiconductor gate placeholders in FET locations;
depositing metal on said wafer;
patterning said deposited metal, metal remaining on at least one semiconductor gate placeholder; and
annealing said wafer, deposited said metal replacing semiconductor material in each said at least one semiconductor gate placeholder.

9. A method of forming FETs as in claim 8, wherein said wafer is a Silicon On Insulator (SOI) wafer, said semiconductor gate placeholders are silicon placeholders and said metal is aluminum (Al), and defining FET locations comprises:

segmenting the surface layer of said SOI wafer, silicon islands being defined from said surface layer; and
doping said silicon islands.

10. A method of forming FETs as in claim 9, wherein forming semiconductor gate placeholders comprises:

forming a layered gate dielectric on said SOI wafer;
forming a silicon layer on said layered gate layer; and
patterning said silicon layer and said layered gate dielectric to define gates, silicon gate placeholders remaining at said FET locations.

11. A method of forming FETs as in claim 10, wherein forming said layered gate dielectric comprises:

forming a high-k dielectric layer on the surface silicon layer;
forming a conductive barrier layer on said high-k dielectric layer; and
forming a second conductive barrier/transition layer on said conductive barrier layer.

12. A method of forming FETs as in claim 11, wherein said method further comprises:

forming silicon contact placeholders in a contact layer on said wafer;
depositing metal on said silicon contact placeholders; and
annealing said wafer, deposited said metal replacing silicon in said contact placeholders.

13. A method of forming Field Effect Transistors (FETs), said method comprising:

defining FET locations on a semiconductor surface layer of a wafer;
forming semiconductor gate placeholders in FET locations;
depositing metal on at least one semiconductor gate placeholder;
annealing said wafer, deposited said metal replacing semiconductor material in each said at least one semiconductor gate placeholder;
forming silicon contact placeholders in a contact layer on said wafer;
depositing metal on said silicon contact placeholders; and
annealing said wafer, deposited said metal replacing silicon in said contact placeholders.

14. A method of forming FETs as in claim 13, wherein forming said silicon contact placeholders comprises:

forming metal caps on said metal gates;
forming a silicon placeholder layer on said wafer;
patterning said silicon placeholder layer; and
forming a dielectric layer planarized to the top of said silicon placeholders.

15. A method of forming FETs as in claim 14, wherein
depositing metal on the silicon gate placeholders and the silicon contact placeholders comprises depositing and patterning an aluminum layer in an aluminum liftoff; and
annealing said wafer comprises a rapid thermal anneal (RTA) at four hundred degrees centigrade (400°) for two hours (2 hrs).

16. A method of forming Integrated Circuit (IC) chips, said method comprising:

defining FET locations on a surface semiconductor layer of a wafer;
forming semiconductor gate placeholders in FET locations;
forming a dielectric layer filling between said semiconductor gate placeholders;
depositing a metal layer on said dielectric layer;
patterning said metal layer in a metal liftoff, metal remaining above said semiconductor gate placeholders;
annealing said wafer in a rapid thermal anneal (RTA) at four hundred degrees centigrade (400°) for two hours (2 hrs), patterned said metal replacing each semiconductor gate placeholder; and
forming wiring to FETs in said FET locations, said wiring connecting said FETs into circuits and said circuits together on an IC chip.

17. A method of forming IC chips as in claim 16, wherein said wafer is a Silicon On Insulator (SOI) wafer, said semiconductor gates are silicon gates, said metal is aluminum (Al), and defining FET locations comprises:

segmenting the surface layer of said SOI wafer, silicon islands being defined from said surface layer; and
doping said silicon islands.

18. A method of forming IC chips as in claim 17, wherein forming semiconductor gate placeholders comprises:

forming a layered gate dielectric on said SOI wafer;
forming a silicon layer on said layered gate layer; and patterning said silicon layer and said layered gate dielectric to define gates, silicon gate placeholders remaining at said FET locations.

19. A method of forming IC chips as in claim 18, wherein forming said layered gate dielectric comprises:
- forming a high-k dielectric layer on the surface silicon layer;
- forming a conductive barrier layer on said high-k dielectric layer; and
- forming a second conductive barrier/transition layer on said conductive barrier layer.

20. A method of forming IC chips as in claim 19, wherein forming said wiring comprises:
- forming silicon contact placeholders in a contact layer on said wafer;
- forming a field dielectric layer between said silicon contact placeholders;
- depositing an aluminum layer on said field dielectric layer;
- patterning said aluminum layer in an aluminum liftoff; and
- annealing said wafer in a rapid thermal anneal (RTA) at four hundred degrees centigrade (400°) for two hours (2 hrs), deposited said aluminum replacing silicon contact placeholders.

21. A method of forming IC chips as in claim 20, wherein forming said silicon contact placeholders comprises:
- forming metal caps on said metal gates;
- forming a silicon placeholder layer on said wafer;
- patterning said silicon placeholder layer;
- forming a dielectric layer on said wafer; and
- planarizing said dielectric layer to the top of said silicon contact placeholders.

* * * * *